United States Patent
Rasheed et al.

(10) Patent No.: US 11,126,916 B2
(45) Date of Patent: Sep. 21, 2021

(54) SYSTEM AND METHOD FOR WELL ARTIFICIAL LIFT LIFECYCLE PLANNING

(71) Applicant: GE Oil & Gas ESP, Inc., Oklahoma City, OK (US)

(72) Inventors: Adam Rasheed, Glenville, NY (US); Mohammed Mounir Shalaby, Niskayuna, NY (US); Shyam Sivaramakrishnan, Schenectady, NY (US); Steven Jay Tyber, Rexford, NY (US)

(73) Assignee: Baker Hughes ESP, Inc., Houston, TX (US)

( * ) Notice: Subject to any disclaimer, the term of this patent is extended or adjusted under 35 U.S.C. 154(b) by 950 days.

(21) Appl. No.: 15/612,937

(22) Filed: Jun. 2, 2017

(65) Prior Publication Data
US 2017/0351959 A1 Dec. 7, 2017

Related U.S. Application Data (60) Provisional application No. 62/344,593, filed on Jun. 2, 2016.

(51) Int. Cl.
*G06N 5/04* (2006.01)
*E21B 43/12* (2006.01)
(Continued)

(52) U.S. Cl.
CPC ............ *G06N 5/04* (2013.01); *E21B 43/121* (2013.01); *E21B 44/00* (2013.01); *G05B 13/047* (2013.01);
(Continued)

(58) Field of Classification Search
CPC ........ E21B 43/121; G06F 30/20; G06F 17/11; G06N 5/04; G06Q 10/06313
See application file for complete search history.

(56) References Cited

U.S. PATENT DOCUMENTS

| | | |
|---|---|---|
| 6,101,447 A | 8/2000 | Poe, Jr. |
| 6,343,656 B1 | 2/2002 | Vazquez et al. |

(Continued)

FOREIGN PATENT DOCUMENTS

| | | |
|---|---|---|
| IN | 201002209 I1 | 12/2013 |
| WO | 2015/070913 A1 | 5/2015 |
| WO | 2015/126423 A1 | 8/2015 |

OTHER PUBLICATIONS

Gutierrez, C.P. & Mejia, J.P., "Statistical Control Applied to Events Detection in Oil Production with Artificial Lift System ESP," II International Congress of Engineering Mechatronics and Automation, pp. 1-6 (Oct. 23-25, 2013).

(Continued)

*Primary Examiner* — Bijan Mapar
(74) *Attorney, Agent, or Firm* — Crowe & Dunlevy, P.C.

(57) ABSTRACT

According to one embodiment, there is provided herein a system and method for producing a well lifecycle lift plan that includes considerations of multiple types of lift, multiple lift configurations associated with each lift type, and can be used to provide a prediction of when or if it would be desirable to change the lift plan at some time in the future. Another embodiment utilizes a heuristic database with rules that might be used to limit the solution space in some instances by restricting the solution to feasible configurations. A further embodiment teaches how multiple individual well optimization results might be combined with a reservoir model to obtain an optimized lift schedule for an entire field.

12 Claims, 5 Drawing Sheets

(51) Int. Cl.
| | |
|---|---|
| G05B 13/04 | (2006.01) |
| G06N 5/00 | (2006.01) |
| G06F 30/20 | (2020.01) |
| G06F 17/11 | (2006.01) |
| E21B 44/00 | (2006.01) |
| G06Q 10/06 | (2012.01) |

(52) U.S. Cl.
CPC .............. *G06F 17/11* (2013.01); *G06F 30/20* (2020.01); *G06N 5/003* (2013.01); *G06Q 10/06313* (2013.01)

(56) References Cited

U.S. PATENT DOCUMENTS

| | | | |
|---|---|---|---|
| 8,078,444 | B2 | 12/2011 | Rashid et al. |
| 8,540,030 | B2 | 9/2013 | Radi |
| 8,600,717 | B2 | 12/2013 | Ashid et al. |
| 9,810,042 | B1* | 11/2017 | Rivas Romero ...... E21B 43/128 |
| 2005/0199391 | A1 | 9/2005 | Cudmore et al. |
| 2012/0095603 | A1* | 4/2012 | Rashid .................... E21B 43/00 700/282 |
| 2012/0095733 | A1 | 4/2012 | Rossi |
| 2012/0215364 | A1 | 8/2012 | Rossi |
| 2013/0173505 | A1 | 7/2013 | Bolagun et al. |
| 2013/0332240 | A1 | 12/2013 | Patri et al. |
| 2018/0321421 | A1* | 11/2018 | Halabe ................. G01V 99/005 |

OTHER PUBLICATIONS

Lea, J.F.,& Nickens, H.V., "Selection of Artificial Lift," SPE Mid-Continent Operations Symposium, pp. 1-32 (Mar. 28-31, 1999).

Ostebo, R., "System-effectiveness Assessment in Offshore Field Development using Life-cycle Performance Simulation," Proceeding annual reliability and maintainability symposium, pp. 375-385 (Jan. 26, 1993).

International Search Report and Written Opinion issued in connection with corresponding PCT Application No. PCT/US17/35856 dated Aug. 21, 2017.

Rasheed et al., "Method for evaluating artificial lift for oil wells," GE U.S. Appl. No. 62/344,581, filed Jun. 2, 2016.

Rasheed et al., "Artificial lift selection layered visualization element," GE U.S. Appl. No. 62/344,545, filed Jun. 2, 2016.

Rasheed et al., "Well lifecycle lift planning through reservoir, operations and production data fusion," GE U.S. Appl. No. 62/344,607, filed Jun. 2, 2016.

Rasheed, A. "Well lifecycle planning visualization," GE U.S. Appl. No. 62/344,562, filed Jun. 2, 2016.

Rasheed & Yousuf, "Lift evaluator self-learning method for rules," GE U.S. Appl. No. 62/344,623, filed Jun. 2, 2016.

* cited by examiner

SYSTEM AND METHOD FOR WELL ARTIFICIAL LIFT LIFECYCLE PLANNING

CROSS REFERENCE TO RELATED APPLICATIONS

This application claims the benefit of U.S. Provisional Patent Application Ser. No. 62/344,593, filed Jun. 2, 2016, titled "METHOD FOR WELL ARTIFICIAL LIFE-CYCLE PLANNING", the entire disclosure of which is incorporated herein by reference as if fully set out at this point.

TECHNICAL FIELD

This disclosure relates generally to production of hydrocarbons and, in more particular, systems and methods for maximizing or optimizing hydrocarbon production from a well over time.

BACKGROUND

Determining the most suitable type of artificial left to employ in a hydrocarbon producing well is a complex decision that involves a number of different factors including, for example, technical feasibility, lift parameters, operating costs, maintenance practices, reliability, target productions, engineering design, company preferences and other factors. Choosing a lift type is often made based on heuristics, rules of thumb, trial and error, an individual's experience with similar wells, etc. In brief, these sorts of decisions are typically made with only a limited analysis of the consequences of a particular lift type.

Further, such a decision will typically be made based on the current status of the well (including its current production rate) and its expected future production as a function time as estimated by a production decline curve or "decline curve", hereinafter. Of course, fluid production from a hydrocarbon well is a dynamic quantity and the lift technology that is appropriate today might not be appropriate in the future.

Additionally, this decision will be made based on only a subset of the available lift types/parameter combinations. There are many different lift types and it is unlikely that all possibilities are considered for use in a particular well. Even after the lift type is selected additional decisions will need to be made regarding the particular equipment configuration. As one specific example, if it appears that an electrical submersible pump would be a good choice for a well, a decision will need to be made regarding the particular pump, motor, and cable to use.

As a result, a conventional lift type selection process incorporates a limited view of what is the most suitable overall solution. Often, the conventional approach does not include technical and lifecycle economic analysis for a wide spectrum of artificial lift types. Further, it also does not contemplate if or when a future change in the well's production will call for replacing the current lift type with a one more suitable to the then-current production level.

Thus, what is needed is a system and method of determining a good or optimal lift schedule that includes a recommendation of an initial choice of artificial lift type and that further includes consideration of when initial lift type of lift needs to be changed in order to maximize the economic value of the well. Thus, what is needed is a tool that can be used to assist in lifecycle planning for a hydrocarbon well over its entire life or some extended time window.

Before proceeding to a description of the present invention, however, it should be noted and remembered that the description of the invention which follows, together with the accompanying drawings, should not be construed as limiting the invention to the examples (or embodiments) shown and described. This is so because those skilled in the art to which the invention pertains will be able to devise other forms of this invention within the ambit of the appended claims.

SUMMARY OF THE INVENTION

According to one embodiment, there is provided herein a system and method for producing a well lifecycle lift plan that includes considerations of multiple types of lift, multiple lift configurations associated with each lift type, and can be used to provide a prediction of when or if it would be desirable to change the lift plan at some time in the future.

In one variation, a method of providing lift type recommendations, including time points when it would be economically advantageous to change same, over a period of time which might include the life time of a well. In this variation, an operating period (e.g., five years) and a calculation interval (e.g., one month) are specified, a plurality of lift types are selected, performance-based models are run at each successive calculation interval/operating point within the operating period for each lift type to identify feasible equipment configurations, optimization is performed across all feasible equipment configurations for all lift types to identify optimum changeover time(s) and equipment, and, an actionable lift changeover plan is generated, preferably with technical and financial details. The actionable lift plan consists of the specific lift equipment configurations and the appropriate changeover times from one lift equipment configuration to another. As part of the generation of the lift plans, financial information such as the net present value, total equipment cost and detailed income statements are produced. The technical details produced along with the lift plan would include parameters such as total fluid, oil, water and/or gas production, the deferred production, the down time, a quantitative risk or technical feasibility score.

Further with respect to the previous example, the optimization is performed using an adaptation of the Bellman (or Bellman-Ford) algorithm which is a linear/dynamic programming scheme that can be used to calculate the minimum distance from a single vertex to all of the other nodes in a network. In one embodiment, the objective function will be some function of the operating cost for that lift type, and lift configuration, for the time period between successive operating points/nodes. This approach provides as an output a plan that specifies the minimum operating cost for the selected well over the indicated time period and the time(s) when it would be advisable to change lift types.

In another variation, a method of providing lift type recommendations is disclosed, including time points when it would be economically advantageous to change same, over the life time of a well. In this variation, an operating period (e.g., five years) and calculation interval (e.g., one month) are specified, a plurality of lift types are selected, performance-based models are run at each operating point within the time interval for each lift type to identify feasible equipment configurations, additionally a heuristic rules engine is run against the feasible configurations to further limit the number of alternatives, optimization is performed across all remaining feasible equipment configurations for all lift types to identify optimum changeover time(s) and equipment, and, a lift changeover plan is generated, preferably with technical and financial details.

In an additional embodiment, an approach styled on the foregoing will be augmented by consultation with a database of heuristic rules that pertain to the well under consideration. These rules might be specific to a single well, applicable to the entire field, or general rules that reflect the operating limitations of the artificial lift types. This database can be used to elimination from consideration lift solutions that, practically speaking, would not be best for a particular well scenario. A determination of feasible alternatives during the lifecycle calculation would potentially cut down on the size of the solution space that needs to be examined at each time point.

There is additionally provided herein a method of managing production in a hydrocarbon producing well, comprising the steps of accessing a decline curve for the well, said decline curve predicting production from the well over a predetermined period of time at a plurality of different time points; selecting a plurality of lift types, each of said lift types being associated with two or more different lift configurations; selecting a time point from among said plurality of different time points; for each of said plurality of lift types and said associated two or more different lift configurations, calculating a performance lift model value at said selected time point; using said decline curve and any of said calculated performance model values at said selected time point to determine a set of feasible equipment configurations at said selected time point; for each of said determined set of feasible equipment configurations at said selected time point, determining an objective function value; performing the previous four steps for each of said plurality of different time points, thereby producing a network of feasible objective function values; determining a minimum travel path through said network of feasible objective function values, thereby obtaining a lifecycle lift plan for the well; and, implementing at least a portion of said lifecycle lift plan for the well.

With reference to another embodiment, the instant application teaches a method of managing production in a hydrocarbon producing well, comprising the steps of: accessing a well lifecycle lift plan calculated according to the steps of: accessing a decline curve for the well, said decline curve predicting production from the well over a predetermined period of time at a plurality of different time points; selecting a plurality of lift types, each of said lift types being associated with two or more different lift configurations; selecting a time point from among said plurality of different time points; for each of said plurality of lift types and said associated two or more different lift configurations, calculating a performance lift model value at said selected time point; using said decline curve and any of said calculated performance model values at said selected time point to determine a set of feasible equipment configurations at said selected time point; for each of said determined set of feasible equipment configurations at said selected time point, determining an objective function value; performing the previous four steps for each of said plurality of different time points, thereby producing a network of feasible objective function values; determining a minimum travel path through said network of feasible objective function values, thereby obtaining a lifecycle lift plan for the well; and, implementing at least a portion of said well lifecycle lift plan for the well.

A still further embodiment is a method of managing production in a hydrocarbon producing well, comprising the steps of: selecting a plurality of lift types, each of said lift types being associated with two or more different lift configurations; in a computer: accessing a decline curve for the well, said decline curve predicting production from the well over a predetermined period of time at a plurality of different time points; selecting a plurality of lift types, each of said lift types being associated with two or more different lift configurations; selecting a time point from among said plurality of different time points; for each of said plurality of lift types and said associated two or more different lift configurations, calculating a performance lift model value at said selected time point; using said decline curve and any of said calculated performance model values at said selected time point to determine a set of feasible equipment configurations at said selected time point; for each of said determined set of feasible equipment configurations at said selected time point, determining an objective function value; performing previous four steps for each of said plurality of different time points, thereby producing a network of feasible objective function values; determining a minimum travel path through said network of feasible objective function values, thereby obtaining a lifecycle lift plan for the well; and, making at least one lift decision for the well based on said lifecycle lift plan.

The foregoing has outlined in broad terms some of the more important features of the invention disclosed herein so that the detailed description that follows may be more clearly understood, and so that the contribution of the instant inventors to the art may be better appreciated. The instant invention is not to be limited in its application to the details of the construction and to the arrangements of the components set forth in the following description or illustrated in the drawings. Rather, the invention is capable of other embodiments and of being practiced and carried out in various other ways not specifically enumerated herein. Finally, it should be understood that the phraseology and terminology employed herein are for the purpose of description and should not be regarded as limiting, unless the specification specifically so limits the invention.

BRIEF DESCRIPTION OF THE DRAWINGS

These and further aspects of the invention are described in detail in the following examples and accompanying drawings.

DETAILED DESCRIPTION

While this invention is susceptible of embodiment in many different forms, there is shown in the drawings, and will herein be described hereinafter in detail, some specific embodiments of the instant invention. It should be understood, however, that the present disclosure is to be considered an exemplification of the principles of the invention and is not intended to limit the invention to the specific embodiments or algorithms so described.

Figure 1:
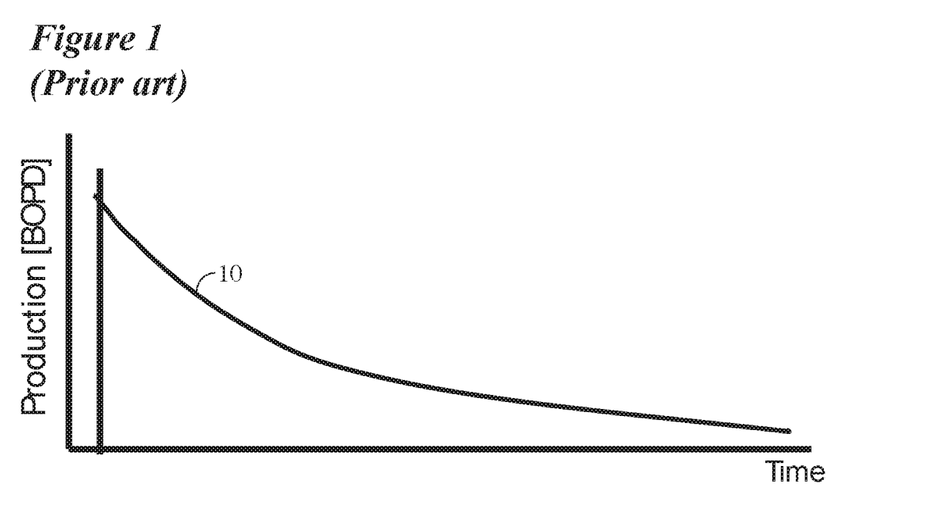
FIG. 1 is a schematic diagram that illustrates a prior art decline curve for a well.

Turning first to FIG. 1 which contains an example of a prior art well decline curve, it is well known in the reservoir engineering field to calculate a decline curve for a particular well. There are numerous acceptable methods of doing this including, for example, Arps algorithm, hyperbolic decline, exponential decline, harmonic decline, etc. FIG. 1 contains a schematic representation of a decline curve which illustrates production rate versus time for a hypothetical well, where "BOPD" on the "Y" axis represents "barrels of oil per day". As is generally indicated, traditionally such curves are estimated using parameters such as an initial production rate value at, say, time $T_0$, an initial decline rate, the degree of curvature of the curve, etc. In other instances, the decline curve might come from a reservoir model. Rules of thumb and heuristics can provide adjustments to the standard decline curve for a well. All of this is well known.

Figure 7:
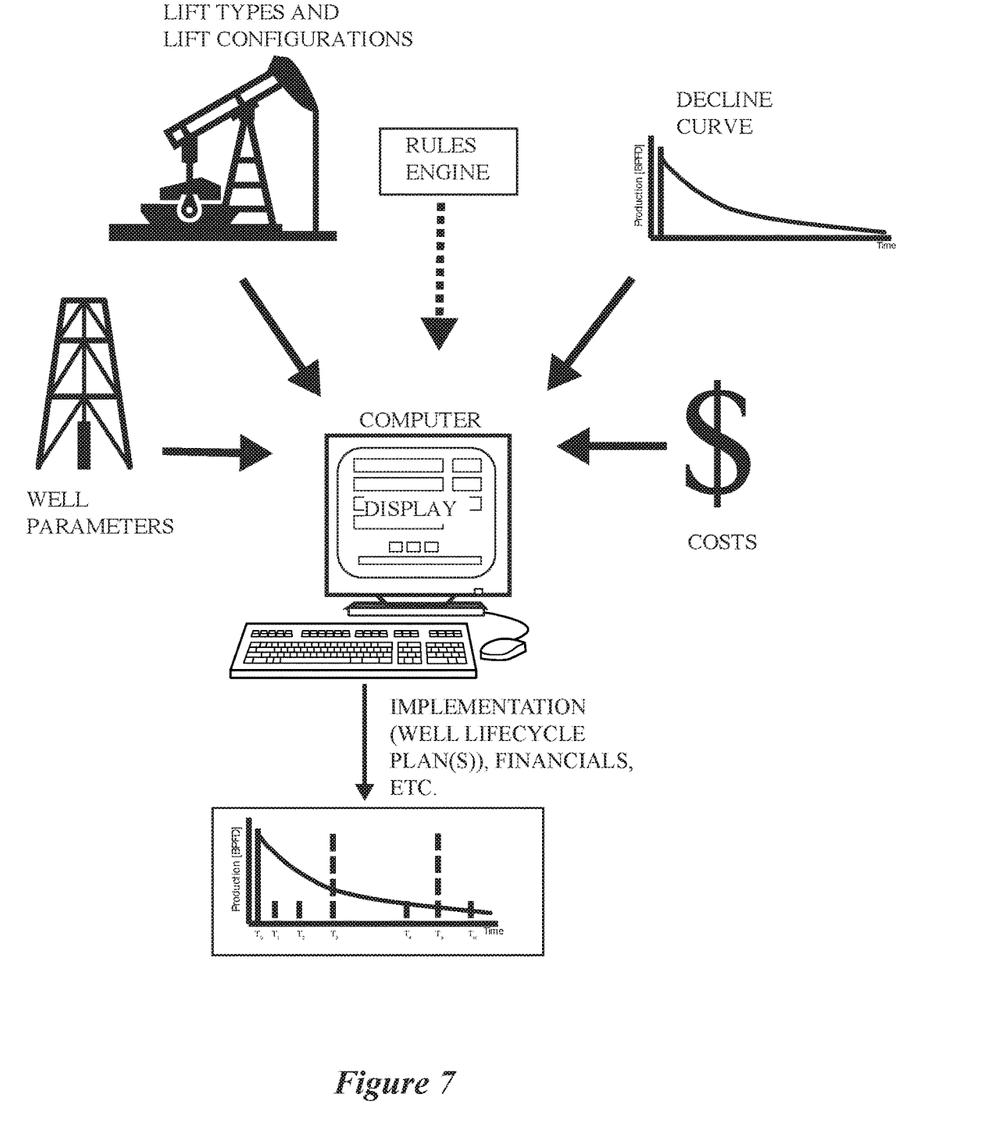
FIG. 7 contains a schematic illustration of an embodiment might be implemented in practice.

FIG. 7 contains an example well lifecycle system according to an embodiment. Parameters pertaining to the selected well will be accessed as input. These parameters might include the well depth, temperature, hydrocarbon type, water cut, etc. Additionally, a decline curve that is representative of the production from selected well over some period of time will be accessed. A selection of lift types and lift type configurations will also be specified. Cost (potentially including both operating and change over cost) is used as an objective function suitable for this embodiment, where the operating/changeover cost is specified for each lift type configuration. Operating cost might include a projection of expected energy cost over the subject time period. Given the foregoing, this embodiment will utilize a computer to produce a well lifecycle or implementation plan by formulating the problem as a network with the distance between nodes being a function of cost and then solving for the minimum distance path through the network. Optionally, a rules engine or rules database that contains heuristic guidelines will used to shape the results of the computation. The solution to the foregoing will be taken into the field and used to determine which lift and lift configuration to install and use (and at which point(s) to change it) over the time period selected.

With respect to the computer of FIG. 7, as a general matter when the term "computer" is used herein, that term should be broadly construed to include any active device including, without limitation, a processing unit, a field programmable gate array, discrete analog circuitry, digital circuitry, an application specific integrated circuit, a digital signal processor, a reduced instruction set computer, devices with multicore CPUs, etc. The foregoing also includes distributed or parallel processing systems where multiple computers contribute to a final solution. In brief, all is required is that the computer be minimally programmable in some sense and capable of accepting input of the sort described above. The computer can some amount of local internal memory (e.g., volatile and/or non-volatile memory devices) and storage, and potentially have access to memory or storage that is connectable to it via a network. The computer may access a computer application program stored in non-volatile internal memory, or stored in an external memory that can be connected to the computer via an input/output (I/O) port. The computer program application may include code or executable instructions that when executed may instruct or cause the central controller and other components to perform steps or functions embodying methods disclosed herein.

Additionally, it is contemplated some sort of display device will typically be accessible to the user so that the results of the optimization may be viewed. Of course, the display might take the form of a printed report, but in most the user will use a video display of some sort. The display might take place on the computer's directly attached graphical display or, more generally, on any display device suitable for presenting graphical and text information to a user. Display devices such as table computers, smart phones, smart terminals, etc., could also be used. In the event that the computational load of the optimization calculation is too much for the display device, the computations could be done remotely and communicated via a network (e.g., wired or wireless Ethernet, Bluetooth, WiFi, a web-based program executed over the Internet, etc.) from the computational computer to the display device.

Figure 2:
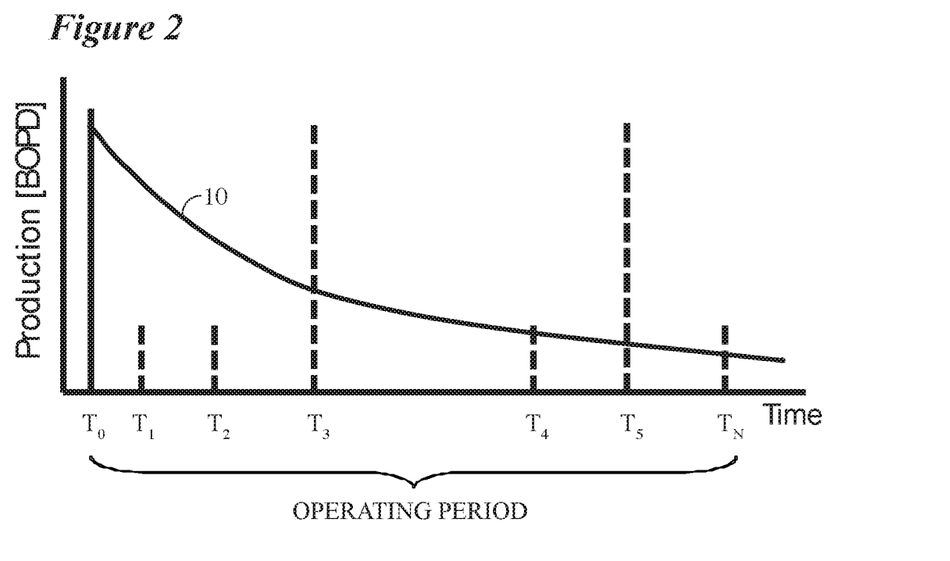
FIG. 2 contains an exemplary schematic diagram that illustrates a lift lifecycle plan for a well.

FIG. 2 contains a simplified schematic representation of one embodiment of a well lifecycle plan produced according to the process of FIG. 7. In this particular example, the lift type and associated parameters related to that lift type are selected at each time point are the ones that minimize the operating cost over the period of time from $T_0$ to $T_N$. In this figure, the type of lift is scheduled to be changed at times $T_3$ and $T_5$. At times $T_1$ and $T_2$ the initially selected lift type is scheduled to be reconfigured with different operating parameters. At $T_4$, the parameters associated with the lift type installed at $T_3$ are reconfigured. Taken together, the changes at $T_0$ to $T_5$ are designed to produce the minimum or near minimum operating cost of producing hydrocarbons from the subject well over the lifecycle/operating period.

Figure 3:
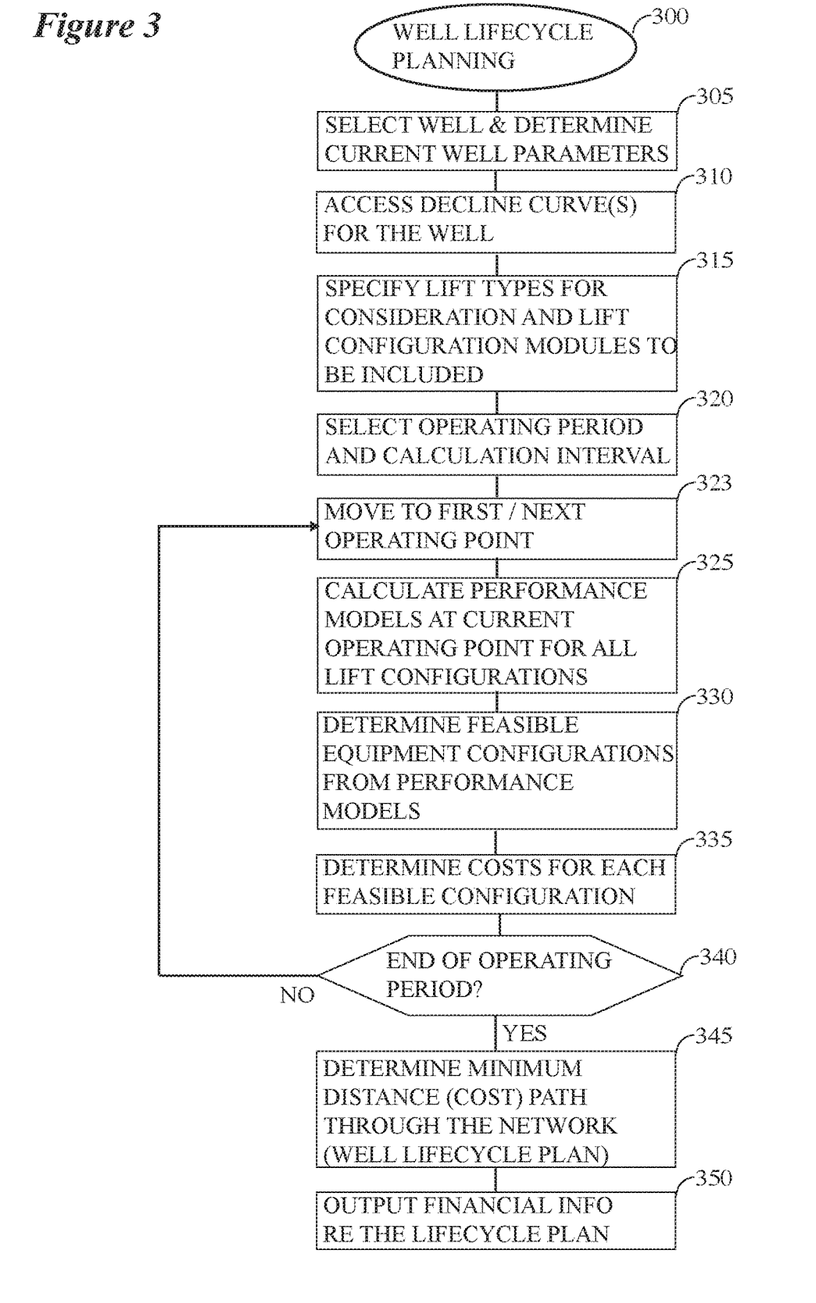
FIG. 3 contains an operating logic suitable for use with an embodiment.

Turning next to FIG. 3, this figure contains a flowchart 300 suitable for use with one embodiment. As an initial step 305, a well will be selected and various parameters about it determined according to methods well known to those of ordinary skill in the art. These parameters could include, for example, its current and historical production rate, the equipment that is currently in place, the depth of the producing formation, the diameter of the well, the oil water contact level, the gas-oil ratio, the oil-water ratio, the pay thickness, the lithology of the producing formation, the composition of the produced fluid (e.g., does it contain corrosive components, sand, etc.), API gravity, bottom hole temperature and pressure, etc. Information related to such might be useful in the steps that follow.

A decline curve or curves is obtained or calculated for the selected well according to methods well known in the art (box 310). Note that for purposes of this figure, a decline curve will be broadly interpreted to be a forecast of the relevant production parameters that would impact lift sizing. Thus, a decline curve might refer to an oil decline curve, a water decline curve, a gas decline curve, total fluid production, some combination of the foregoing, etc. In some embodiments that calculation will be done outside of the optimization program that is described below in connection with box 345. Note that there are many different ways to obtain this curve as discussed above, but the particular method by which it is obtained is not important to the operation of the current embodiment.

Candidate lift types and available lift configuration modules for each lift type will need to be identified 315. Note that for purposes of the instant disclosure a "lift configuration module" is defined by a lift technology, i.e., the set of components used, any specialized configuration for the technology, and the range of operating conditions covered by the technology. Table 1 below contains some exemplary lift types and some configurable hardware components associated with each. As an example and for purposes of the instant embodiment, configuration of an electrical submersible pump (ESP) will involve sizing of a particular pump, motor, and cable length between the surface and pump.

Similarly, the performance of a PCP (progressing cavity pump) can be largely characterized by its pump, drivehead, and rods. Other examples of lift type and configuration parameters are given below. That being said, those of ordinary skill in the art will recognize that there are additional components that could be used in addition to or in place of those listed in the table that follows.

TABLE 1

Some Selected Lift Types and Exemplary Configuration Parameters

| LIFT TYPE | CONFIGURATION PARAMETER |
| --- | --- |
| ESP | Pump |
|  | Motor |
|  | Cable |
| Rod Lift | BPU |
|  | Motor |
|  | Rods |
|  | Plunger |
| PCP | Pump |
|  | Drivehead |
|  | Rods |
| Gas Lift | Valve depth range |
| Plunger Lift | Plungers |

Continuing with the embodiment of FIG. 3, an operating period and calculation interval 320 will be selected. One combination of these two parameters that has proven to be useful in some instances is five years of operation calculated at monthly time intervals. Those of ordinary skill in the art will recognize that the extent of the operating time period might be longer or shorter and the number of time intervals increased or decreased depending on the characteristics of the chosen well and other factors. Clearly, as the operating time period increases and/or the calculation time interval decreases, the optimization problem will require more computer resources to calculate.

Next in the embodiment of FIG. 3, the first or next operating point will be selected 323, with the "first" point typically being the current time and the next point being separated in time from the first by the calculation interval, e.g., by one month.

According to this example, the first (or next, if this is the second or subsequent time passing through this box 323) will be identified and performance models will be calculated for each lift configuration (box 325) at the identified operating point. That is, given the well parameters and lift type the associated components will be sized according to standard petroleum engineering techniques at the current time point on the decline curve. For example, in the case of rod lift, standard RPL-12 provides guidance with respect to how to size it for different production and well scenarios.

In box 330, the universe of available equipment configurations of 325 will be examined to determine which are actually feasible for the given well at this time point as determined by the performance-model calculations. By eliminating those configurations that are not feasible at this point the size of the optimization that must be solved can potentially be substantially reduced. Of course, this step is not essential to the operation of this embodiment but it has proven to be useful in some instances to reduce the solution space that must be searched in order to find a minimum cost lifecycle plan. This might be done in many ways, but one useful approach is generally illustrated by the curves in FIG. 5.

In brief, in the current embodiment lift configurations that have a performance envelope that does not enclose the decline curve will be designated as "not feasible". In more particular, in FIG. 5 at time $T_0$ four different artificial lift candidates have been identified: ESP1 (a first electrical submersible pump configuration), ESP (a second electrical submersible pump configuration), RP (a reciprocating piston configuration), and GL (a gas lift configuration). Of the four, ESP1 has been selected as an initial lift technology. The points in time at which well is to be evaluated for a possible change in the lift type are indicated by data points 530.

Figure 5:
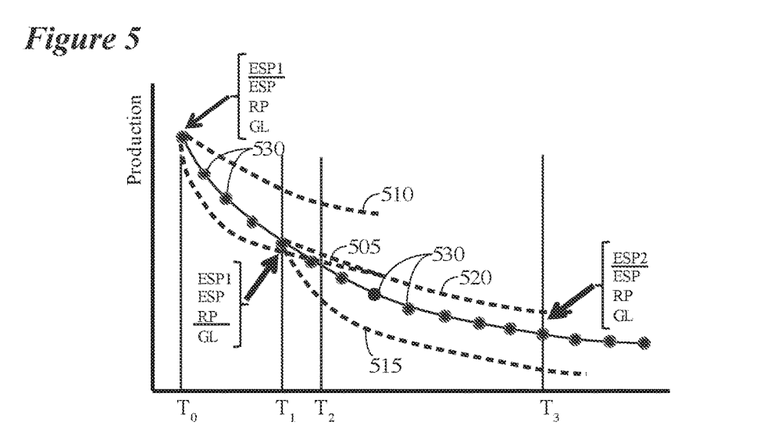
FIG. 5 illustrates a situation where a lift configuration might be excluded from consideration at a point in time where the decline curve does not fall within the boundaries of its performance envelope.

In this figure, the points $T_1$ and $T_3$ have been identified using an approach disclosed below as times when the lift could be changed to minimize the cost of lifting the hydrocarbons to the surface for this well. In the example of FIG. 5, at $T_1$ the recommendation is to change to the RP lift type. At $T_3$, the recommendation is to change to lift configuration ESP2.

Associated with ESP1 is the operating envelope for this particular lift configuration which is indicated by curves 505 and 510. As can be noted in this figure, between times $T_0$ and $T_2$ the operating envelope for ESP1 encloses the projected decline curve for the well. However, at point $T_2$ the lower limit of the envelope crosses the decline curve 530. Beyond that point ESP1 is not a feasible solution and does not need to be considered as an option for calculation points 530 that follow $T_2$. Thus, in this example it can be removed from the solution set for times after $T_2$. At point $T_1$ the recommendation is to change to lift type RP. The operating envelope for the selected RP configuration is shown as curves 515 and 520, which surround the projected decline curve past point $T_3$ which is the next point at which the recommendation is to change the lift type. In fact, the RP configuration envelope is projected to be feasible beyond that $T_3$ but based on a cost analysis the recommendation is to change the lift type to another configuration of an ESP lift at this point, i.e., to ESP2 in this figure.

Returning now to the embodiment of FIG. 3, once the feasible solutions have been identified and those which are not feasible have been eliminated, the remaining collection of solutions is conceptualized as a network of nodes, with each node corresponding to one of the feasible solutions. This information is then used to determine the costs for the remaining lift types and lift configurations (box 335) at each node. In some cases, cost might include both the operating cost for the calculation interval and the cost of changing over to a different lift type or configuration. Note that, as explained below, the operating cost is just one of many possible objective functions that could be used in the calculation that follows. Preferably, this will include at least the cost of the power (e.g., electricity) required to operate the lift for a period of time corresponding to the calculation interval. Additionally, other costs such as the installation and equipment cost, the preventive maintenance costs, the (e.g., monthly) operating costs, the mean time between equipment failure and workover costs, etc., might be obtained for each type of lift. Further, and if desired, the depreciation of the lift equipment might be included as an item. The power usage can be calculated from performance models of each lift type/configuration combination. The expected cost could also be compared with a projected revenue stream calculation for this well to yield an estimate of the income for the operating period if desired. For example, the projected hydrocarbon price and production from the well as predicted by the decline curve could be used to estimate the revenue for that period. The objective function could also be expressed in terms of any of the previous criteria weighted by a heuristic technical risk or other deterministic of heuristic criteria. Finally, it should be noted and remembered that even though a "minimum" travel distance is obtained, any maximization problem can readily be recast as a minimization problem, and vice versa. Thus, when the term "minimization" is used herein, that should be broadly construed to include objective functions where the goal is to obtain a maximum.

If the end of the operating period has not been reached (the "NO" branch of decision item 340), the next operating point will be selected and the above process repeated. On the other hand, if the last operating point has been processed (the "YES" branch of decision item 340), the network of nodes produced above together with the associated cost of each will be used as follows.

If the last time point has been reached, the loop 323-340 will exit and the nodes and associated costs will be used to calculate a minimum cost well lifecycle plan. The lifecycle plan can then be budgeted for and implemented 345 in the field. As an example, and referring again to the example, of FIG. 2, the well operator should budget to reconfigure the existing lift configuration at time $T_1$ and $T_2$, replace the lift at time $T_3$, reconfigure the replacement lift at T4 and install another lift configuration at $T_5$. Note that in some instances financial information could be provided in connection with the assembled lifecycle plan (e.g., net present value of the expected cost or revenue time series, etc.).

If it is determined that the end of the designated time interval has been reached, the minimum cost path will be assembled and presented to a user as the low-cost lifecycle plan (step 350). The user will then be able to implement the plan by, for example, budgeting and planning for lift changes at predicted times in the future. Then when the designated time arrives, the lift can be changed according to the plan as originally calculated to subsequently modified. Subsequent modification might include, for example, instances where the decline curve in the future proves to be significantly different from the estimated decline curve when the calculation was done.

Additionally, and in some embodiments, certain financial information optionally might be calculated and made available to a user to assist in deciding whether or not (or which) lifecycle plan to implement (step 355). The sort of financial information that might be useful would include, for example, the net present value of the operating cost assuming a discount rate or discount rate function, the expected profit from implementing the plan assuming an estimate of the future oil or other hydrocarbon price, etc. Given a series of cost estimates and/or income estimates together with a discount rate, it is well known how to determine the net present value of a cash stream and such might be useful in determining which calculated lift plan to implement.

Turning next to an example of the sort of computations that would be required to solve the well lifecycle problem. As an example, the number of feasible configurations for a given well can be in the thousands to tens of thousands for each lift type at each operating point. So, as a rough order of magnitude, assume that each lift type has 5000 configurations and there are 6 lift types. That would imply that there are 30000 possible configurations at each calculation point 530 in FIG. 5. Using 60 operating points (monthly for 5 years) results in $30000^{60}=4.2*10^{268}$ possible combinations. Hence a gradient based or brute forced approach is not likely to be feasible, although that approach might be used for small scale problems.

Given the number of potential permutations (given that a lift type can either be changed out or resized on any given day over the life of the well), one approach to solving the problem has two broad components. The first is to develop performance models of each lift type. Optionally, and to reduce the size of the solution set, the feasible configurations at every operating point on the decline curve will be determined. For example, at the first operating point, there might be 8 different specific ESP configurations and 14 specific rod-pumping feasible configuration. Similarly, the second operating point might have another set of configurations, many of which may overlap with the set for the first operating point. In this manner, by identifying all the feasible lift configurations for each operating point, a wrapper optimization can then be invoked as the second step to perform the life cycle optimization.

Then, a solution may be obtained by casting it as a minimum travel path problem through a network of nodes, where the distances between nodes are couched in terms of the operational "costs" of each lift configuration. That being said, there are many other objective functions that could be utilized including, for example, maximizing profits, maximizing revenue, maximizing production, minimizing cost, minimizing down time, minimizing deferred production, minimizing capital expenditure over a time period (e.g., the first year less funds might be available). Any of the foregoing could be recast as a "distance" in a linear programming or dynamic programming problem.

Figure 4:
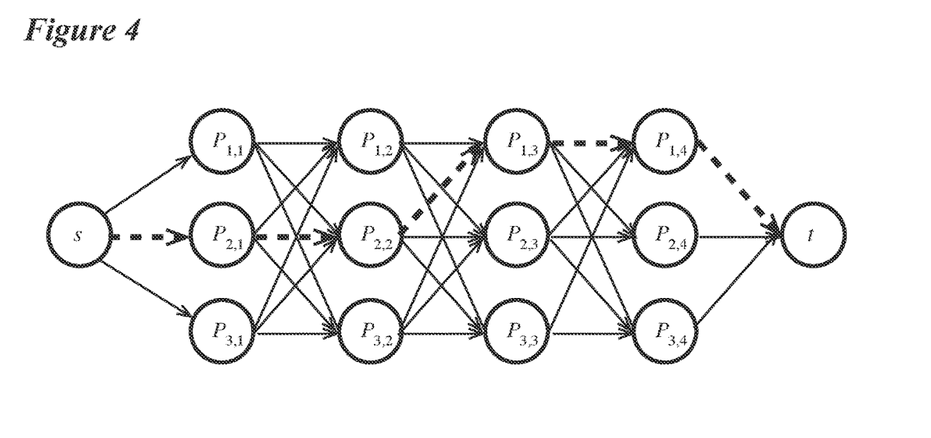
FIG. 4 contains a simplified illustration of how a lift lifecycle plan for a well might be calculated.

FIG. 4 provides a simple explanation of one way this computation might be performed. That figure contains a conceptual illustration of a situation where there are 3 lift types and 4 operating conditions, or a total of 12 nodes at four different operating points. Let $P_{i,j}$ represent lift "i" and operating condition "j". The heavy dashed line indicates the minimum cost/distance path through the nodes of the graph determined according to an embodiment. The selected (dashed) path indicates that lift 2 is installed and used for operating conditions 1 and 2. Then lift 1 is installed and used for operating condition 3 and 4.

More generally, consider a shortest path between s and t ... $sP_{i_1,1}$ $P_{i_2,2}$ ... $P_{i_n,n}$t. One way to solve this problem would be to use a variation of the well-known Bellman's algorithm which is a scheme that can be used to calculate the minimum distance from a single vertex to all of the other nodes in a network. In brief, according to this method the path between s and any intermediate node $P_{i_k,k}$ is selected to be the shortest possible such path. This idea can be implemented as an algorithm where the shortest known path between s and any other node is determined. Let, d' be the shortest known path, at operating condition 3 in this figure the goal is to pick the shortest path from operating condition 2 to 3:

$$d(P_{1,3}) \leq \min\{d', d(P_{2,2}) + c(P_{2,2}, P_{1,3})\}$$

This equation conceptually means to find the shortest path from s to $P_{2,2}$ plus the cost of operating lift 2 under condition 2 and changing over to lift 1.

In some embodiments, the application of this method will begin at the end point t and work backward toward the start. That is not required but it has proven to be useful in some situations.

Because of the enormous magnitude of the fully specified problem, it is advantageous to reduce the solution set in various ways. One way to do this is to reduce the length of the planning horizon and/or frequency at which calculations are made. As one example of workable values, in some cases a 5 year planning horizon and, monthly granularity/calculation interval has been useful. Reducing the calculation interval (e.g., to every other month, every six months, etc.)

or the planning interval could potentially reduce the magnitude of the problem significantly if such were desired.

By way of example of the sort of data that might be useful as input to the instant method, the initial well specification will likely be needed and might contain information about the depth of the well, hole diameter, thickness of the producing formation, gas/oil ratio, oil/water ratio, etc. Those of ordinary skill in the art will recognize that there are many other well parameters that might be useful depending on the context. Lift data, physical and/or operational parameters associated with each type of lift under consideration, will need to be assembled for the chosen well. If a financial analysis is to be performed, data such as the projected inflation rate, discount rate, price of power, oil price, installation cost, lift equipment cost, down time if the lift type is changed or worked over, minimum installation period, operating cost, mean time between failure, and workover cost, might be used in the cost calculation. Deferred production could be treated as a cost, if desired.

Of course, it should be understood that minimization of the objective function could be further constrained in some embodiments. For example, it might be desirable in some cases to limit the number of lift changes over the lifetime of the well to, say, one, two, or three, etc. Additionally, in some embodiments it might be desirable to include a bias toward keeping the then-current lift in place. That is, if the cost of operating the current lift type differs only slightly from a different calculated optimum lift cost, it might make sense not to make the change at that time. Further, if it should happen that there are several well lifecycle plans that are nearly optimal, it might make sense to select the one that involves the fewest lift changes.

Figure 6:
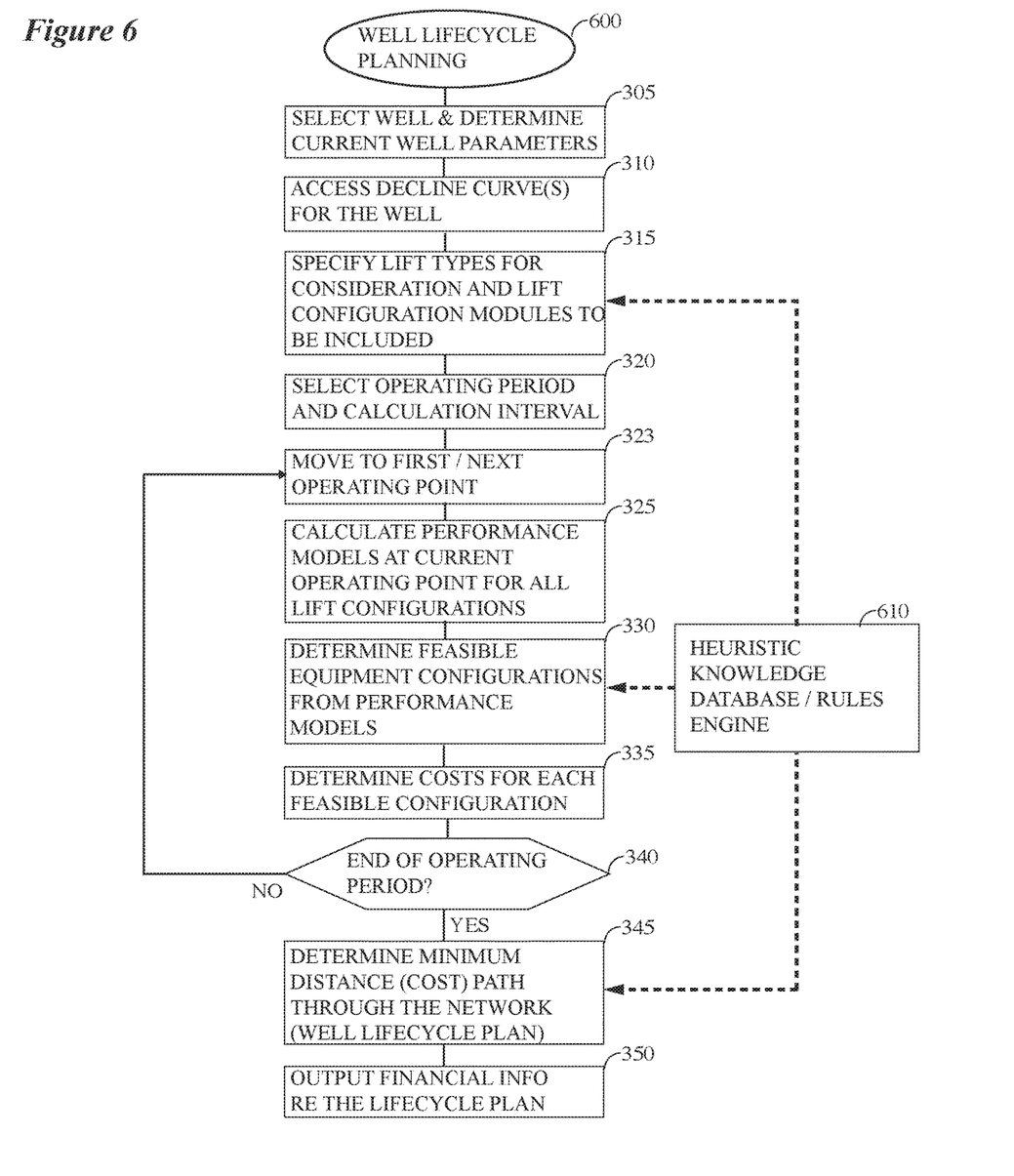
FIG. 6 contains an operating logic suitable for another embodiment.

Turning next to FIG. 6, there is provided a method 600 of determining an optimum or near optimum solution to a well lifecycle planning problem substantially as described above, but wherein a database of "rules of thumb" or heuristic information 610 is provided that can be used to further limit the number of feasible solutions that must be examined and/or eliminate or elevate the recommendation of a calculated lifecycle plan. Note that this sort of information might be either be sourced locally (e.g., certain types of lifts are preferred in particular fields) or global (e.g., some lift types are disfavored or incompatible with some downhole environments). For example, if the produced fluid contains a substantial corrosive constituents or sand is being produced along with oil, an electrical submersible pump might be eliminated from consideration in some wells. Those of ordinary skill in the art will recognize that there are similar accepted industry heuristic rules that might be used to reduce the number of candidate lift mechanisms at this stage. In FIG. 6, this additional information might optionally be provided at one or more points in the lifecycle determination process.

As is generally indicated in FIG. 6, the information in the rules engine 610 might be used as input at one or more different points in the planning process. As is indicated and by way of example only, in one embodiment the rules engine could be used at the outset 315 to limit the choice of lift types and/or again in conjunction with item 330 to reduce the size of the solution set. For example, in some cases experience in the field would indicate that certain types of lift or certain lift configurations would not provide the predicted performance. Point 330 would be a good point computation-wise to use information to further eliminate solutions that might have no or limited chance of being adopted even if they were determined to be the low-cost solution.

Additionally, the information in the rules engine 610 could be used to screen the recommended solution in box 345. There might be any number of reasons why a particular lift solution, even if technically the lowest cost, might not be desirable at that point in time. As such, the rules engine at step 345 could act as a final check on the feasibility or desirability of the proposed entire lifecycle plan. Of course, all of the points where the rules engine 610 might be involved (steps 330, 340, and 350) are optional and none, one, two, or all of them might be used in a given embodiment.

With respect to the rules engine, while there are many ways to build a rule or a "rule of thumb"-based database. In one embodiment, the rules are of three types. The first rule type is expressed as depth versus volume lookup tables for each lift type and sub-tables exist for each casing and tubing size. These tables were based on calculations performed using design software as well as typical rules of thumb from prior experience. The second category consists of "Disallow" rules expressed as "IF . . . THEN . . . Disallow" which causes the lift type to be disallowed if even just one such rule is triggered (e.g., the lift is too big for the well). An example would be if a lift type physically cannot fit into the wellbore. In such a case, the evaluation of any other rules is irrelevant since the lift type simply cannot work. The third category consists of "Warning Rules" expressed as "IF . . . THEN . . . Add Penalty", for which satisfying the IF statement results in a penalty deducted from the lift type. Each warning rule might have a different penalty factor depending on the severity of it being violated since some rules of thumb are more severe than others. The penalties associated with multiple warning rules could be added together or otherwise combined (e.g., a weighted average, a total, a geometric average, the maximum of the penalties, etc., could be computed) in determining the overall penalty for the given lift type and configuration. In some cases, the penalty could be applied to cost information at each node to make its "distances" to the next node longer, thereby making it more disfavored in the final solution.

It is to be understood that the terms "including", "comprising", "consisting" and grammatical variants thereof do not preclude the addition of one or more components, features, steps, or integers or groups thereof and that the terms are to be construed as specifying components, features, steps or integers.

If the specification or claims refer to "an additional" element, that does not preclude there being more than one of the additional element.

It is to be understood that where the claims or specification refer to "a" or "an" element, such reference is not be construed that there is only one of that element.

It is to be understood that where the specification states that a component, feature, structure, or characteristic "may", "might", "can" or "could" be included, that particular component, feature, structure, or characteristic is not required to be included.

Where applicable, although state diagrams, flow diagrams or both may be used to describe embodiments, the invention is not limited to those diagrams or to the corresponding descriptions. For example, flow need not move through each illustrated box or state, or in exactly the same order as illustrated and described.

Methods of the present invention may be implemented by performing or completing manually, automatically, or a combination thereof, selected steps or tasks.

The term "method" may refer to manners, means, techniques and procedures for accomplishing a given task including, but not limited to, those manners, means, techniques and procedures either known to, or readily developed from known manners, means, techniques and procedures by practitioners of the art to which the invention belongs.

For purposes of the instant disclosure, the term "at least" followed by a number is used herein to denote the start of a range beginning with that number (which may be a ranger having an upper limit or no upper limit, depending on the variable being defined). For example, "at least 1" means 1 or more than 1. The term "at most" followed by a number is used herein to denote the end of a range ending with that number (which may be a range having 1 or 0 as its lower limit, or a range having no lower limit, depending upon the variable being defined). For example, "at most 4" means 4 or less than 4, and "at most 40%" means 40% or less than 40%. Terms of approximation (e.g., "about", "substantially", "approximately", etc.) should be interpreted according to their ordinary and customary meanings as used in the associated art unless indicated otherwise. Absent a specific definition and absent ordinary and customary usage in the associated art, such terms should be interpreted to be ±10% of the base value.

When, in this document, a range is given as "(a first number) to (a second number)" or "(a first number)–(a second number)", this means a range whose lower limit is the first number and whose upper limit is the second number. For example, 25 to 100 should be interpreted to mean a range whose lower limit is 25 and whose upper limit is 100. Additionally, it should be noted that where a range is given, every possible subrange or interval within that range is also specifically intended unless the context indicates to the contrary. For example, if the specification indicates a range of 25 to 100 such range is also intended to include subranges such as 26-100, 27-100, etc., 25-99, 25-98, etc., as well as any other possible combination of lower and upper values within the stated range, e.g., 33-47, 60-97, 41-45, 28-96, etc. Note that integer range values have been used in this paragraph for purposes of illustration only and decimal and fractional values (e.g., 46.7-91.3) should also be understood to be intended as possible subrange endpoints unless specifically excluded.

It should be noted that where reference is made herein to a method comprising two or more defined steps, the defined steps can be carried out in any order or simultaneously (except where context excludes that possibility), and the method can also include one or more other steps which are carried out before any of the defined steps, between two of the defined steps, or after all of the defined steps (except where context excludes that possibility).

Further, it should be noted that terms of approximation (e.g., "about", "substantially", "approximately", etc.) are to be interpreted according to their ordinary and customary meanings as used in the associated art unless indicated otherwise herein. Absent a specific definition within this disclosure, and absent ordinary and customary usage in the associated art, such terms should be interpreted to be plus or minus 10% of the base value.

Still further, additional aspects of the instant invention may be found in one or more appendices attached hereto and/or filed herewith, the disclosures of which are incorporated herein by reference as if fully set out at this point.

Thus, the present invention is well adapted to carry out the objects and attain the ends and advantages mentioned above as well as those inherent therein. While the inventive device has been described and illustrated herein by reference to certain preferred embodiments in relation to the drawings attached thereto, various changes and further modifications, apart from those shown or suggested herein, may be made therein by those of ordinary skill in the art, without departing from the spirit of the inventive concept the scope of which is to be determined by the following claims.

What is claimed is:

1. A method of managing production in a hydrocarbon producing well, comprising the steps of:
    a. accessing a decline curve for the well, said decline curve predicting production from the well over a predetermined period of time at a plurality of different time points;
    b. selecting a plurality of lift types, each of said lift types being associated with two or more different lift configurations;
    c. selecting a time point from among said plurality of different time points;
    d. for each of said plurality of lift types and said associated two or more different lift configurations, calculating a performance lift model value at said selected time point;
    e. using said decline curve and any of said calculated performance model values at said selected time point to determine a set of feasible equipment configurations at said selected time point;
    f. for each of said determined set of feasible equipment configurations at said selected time point, determining an objective function value;
    g. performing steps (c) through (f) for each of said plurality of different time points, thereby producing a network of feasible objective function values;
    h. determining a minimum travel path through said network of feasible objective function values, thereby obtaining a lifecycle lift plan for the well that includes changing from a first of the plurality of lift types to a second of the plurality of lift types at one of the plurality of different time points; and,
    i. implementing at least a portion of said lifecycle lift plan for the well by changing from the first of the plurality of lift types to the second of the plurality of lift types.

2. The method of managing production in a hydrocarbon producing well according to claim 1, wherein said objective function value is a cost objective function value.

3. The method of managing production in a hydrocarbon producing well according to claim 1, wherein said objective function value is one of a maximum production value, a minimum changeover cost value, and a minimum downtime value.

4. The method of managing production in a hydrocarbon producing well according to claim 1, wherein step (f) comprises the step of: for each of said determined set of feasible equipment configurations at said selected time point, determining an objective function value that includes a cost to operate said feasible equipment configuration for a predetermined period of time.

5. The method of managing production in a hydrocarbon producing well according to claim 3, wherein said predetermined period of time is five years.

6. The method of managing production in a hydrocarbon producing well according to claim 1, wherein said objective function is a cost objective function and step (h) comprises the steps of
    (h1) determining a minimum travel path through said network of feasible cost objective function values, thereby obtaining a lifecycle lift plan for the well, and,
    (h2) based on said lifecycle lift plan calculating a net present value of said minimum travel path through said network of feasible cost objective function.

7. The method of managing production in a hydrocarbon producing well according to claim 1, wherein is provided a rules engine, and wherein step (e) comprises the step of:
   e. using said decline curve, any of said calculated performance model values at said selected time point, and said rules engine to determine a set of feasible equipment configurations at said selected time point.

8. The method of managing production in a hydrocarbon producing well according to claim 1, wherein a rules engine is provided containing a plurality of heuristic risk values, and wherein said objective function value comprises a cost objective function value weighted by one or more of said heuristic risk values.

9. The method according to claim 1, wherein said decline curve predicts a production of at least one of gas, oil, and water as a function of time.

10. The method according to claim 1, wherein said determined objective function value of step (f) comprises at least one of a cost to operate, a cost of a changeover, a cost of a work over, and a cost of a power usage.

11. A method of managing production in a hydrocarbon producing well, comprising the steps of:
   a. accessing a well lifecycle lift plan calculated according to the steps of:
     (1) accessing a decline curve for the well, said decline curve predicting production from the well over a predetermined period of time at a plurality of different time points;
     (2) selecting a plurality of lift types, each of said lift types being associated with two or more different lift configurations;
     (3) selecting a time point from among said plurality of different time points;
     (4) for each of said plurality of lift types and said associated two or more different lift configurations, calculating a performance lift model value at said selected time point;
     (5) using said decline curve and any of said calculated performance model values at said selected time point to determine a set of feasible equipment configurations at said selected time point;
     (6) for each of said determined set of feasible equipment configurations at said selected time point, determining an objective function value;
     (7) performing steps (3) through (6) for each of said plurality of different time points, thereby producing a network of feasible objective function values;
     (8) determining a minimum travel path through said network of feasible objective function values, thereby obtaining a lifecycle lift plan for the well that includes changing from a first of the plurality of lift types to a second of the plurality of lift types at one of the plurality of different time points; and,
   b. implementing at least a portion of said well lifecycle lift plan for the well by changing from the first of the plurality of lift types to the second of the plurality of lift types.

12. A method of managing production in a hydrocarbon producing well, comprising the steps of:
   a. in a computer:
     (1) accessing a decline curve for the well, said decline curve predicting production from the well over a predetermined period of time at a plurality of different time points;
     (2) selecting a plurality of lift types, each of said lift types being associated with two or more different lift configurations;
     (3) selecting a time point from among said plurality of different time points;
     (4) for each of said plurality of lift types and said associated two or more different lift configurations, calculating a performance lift model value at said selected time point;
     (5) using said decline curve and any of said calculated performance model values at said selected time point to determine a set of feasible equipment configurations at said selected time point;
     (6) for each of said determined set of feasible equipment configurations at said selected time point, determining an objective function value based in part on one or more heuristic risk values;
     (7) performing steps (3) through (6) for each of said plurality of different time points, thereby producing a network of feasible objective function values;
     (8) determining a minimum travel path through said network of feasible objective function values, thereby obtaining a lifecycle lift plan for the well that includes changing from a first of the plurality of lift types to a second of the plurality of lift types at one of the plurality of different time points; and,
   b. making at least one lift decision for the well based on said lifecycle lift plan.

\* \* \* \* \*